US00RE50540E

(19) United States
(12) Reissued Patent
Hoogenboom et al.

(10) Patent Number: US RE50,540 E
(45) Date of Reissued Patent: Aug. 19, 2025

(54) METHOD FOR INSPECTING A SAMPLE USING AN ASSEMBLY COMPRISING A SCANNING ELECTRON MICROSCOPE AND A LIGHT MICROSCOPE

(71) Applicant: DELMIC IP B.V., Delft (NL)

(72) Inventors: Jacob Pieter Hoogenboom, Delft (NL); Nalan Liv Hamarat, Delft (NL); Pieter Kruit, Delft (NL)

(73) Assignee: DELMIC IP B.V., Delft (NL)

(21) Appl. No.: 17/742,946

(22) Filed: May 12, 2022

Related U.S. Patent Documents

Reissue of:
(64) Patent No.: 10,651,009
Issued: May 12, 2020
Appl. No.: 15/328,439
PCT Filed: Jul. 20, 2015
PCT No.: PCT/NL2015/050528
§ 371 (c)(1),
(2) Date: Jan. 23, 2017
PCT Pub. No.: WO2016/013930
PCT Pub. Date: Jan. 28, 2016

(30) Foreign Application Priority Data

Jul. 25, 2014 (NL) ..... 2013262

(51) Int. Cl.
*H01J 37/22* (2006.01)
*G01N 21/64* (2006.01)
(Continued)

(52) U.S. Cl.
CPC ..... *H01J 37/228* (2013.01); *G01N 21/6458* (2013.01); *G01N 23/2251* (2013.01);
(Continued)

(58) Field of Classification Search
CPC ..... G01N 21/6458; G01N 2223/408; G01N 23/2251; G02B 21/244; G02B 21/34;
(Continued)

(56) References Cited

U.S. PATENT DOCUMENTS 7,164,128 B2 * 1/2007 Miyamoto ..... G01B 15/04 250/311
7,589,322 B2 * 9/2009 Nishikata ..... H01J 37/256 250/306
(Continued)

FOREIGN PATENT DOCUMENTS

EP 2108947 A2 10/2009
JP 2001093458 A 12/2015

OTHER PUBLICATIONS

Written Opinion received for PCT Patent Application No. PCT/NL2015/050528, dated Dec. 17, 2015, 10 pages.
(Continued)

*Primary Examiner* — Peng Ke
(74) *Attorney, Agent, or Firm* — Workman Nydegger

(57) ABSTRACT

The invention relates to a method for inspecting a sample with an assembly comprising a scanning electron microscope (SEM) and a light microscope (LM). The assembly comprises a sample holder for holding the sample. The sample holder is arranged for inspecting the sample with both the SEM and the LM, preferably at the same time. The method comprising the steps of: capturing a LM image of the sample in its position for imaging with the SEM; determining a position and dimensions of a region of interest in or on the sample using the LM image; determining values to which the SEM parameters need to be set to image the sample at a desired resolution; and capturing a SEM image of the region of interest, preferably using the first electron beam exposure of said region of interest.

37 Claims, 5 Drawing Sheets

(51) Int. Cl.

| | |
|---|---|
| ***G01N 23/2251*** | (2018.01) |
| ***G02B 21/24*** | (2006.01) |
| ***G02B 21/34*** | (2006.01) |
| ***G02B 21/36*** | (2006.01) |
| ***H01J 37/20*** | (2006.01) |
| ***H01J 37/21*** | (2006.01) |
| ***H01J 37/28*** | (2006.01) |

(52) U.S. Cl.
CPC ..... *G02B 21/244* (2013.01); *G02B 21/34* (2013.01); *G02B 21/365* (2013.01); *G02B 21/368* (2013.01); *H01J 37/20* (2013.01); *H01J 37/21* (2013.01); *H01J 37/28* (2013.01); *G01N 2223/408* (2013.01); *H01J 2237/2003* (2013.01); *H01J 2237/2826* (2013.01)

(58) Field of Classification Search
CPC ..... G02B 21/365; G02B 21/368; H01J 2237/2003; H01J 2237/2826; H01J 37/20; H01J 37/21; H01J 37/228; H01J 37/28
See application file for complete search history.

(56) References Cited

U.S. PATENT DOCUMENTS

| | | | | |
|---|---|---|---|---|
| 7,888,643 | B2 * | 2/2011 | Albiez | H01J 37/22 356/615 |
| 8,283,641 | B2 * | 10/2012 | Donitz | H01J 37/28 250/492.1 |
| 9,268,126 | B2 * | 2/2016 | Edelmann | H01J 37/228 |
| 9,431,213 | B2 * | 8/2016 | Shachal | H01J 37/18 |
| 9,523,714 | B2 * | 12/2016 | Kadyshevitch | H01J 33/00 |
| 2002/0090127 | A1 * | 7/2002 | Wetzel | G01B 7/003 382/133 |
| 2004/0051040 | A1 * | 3/2004 | Nasu | G01B 15/00 250/310 |
| 2005/0139781 | A1 * | 6/2005 | Hazaki | G01N 23/225 255/442.11 |
| 2006/0138341 | A1 * | 6/2006 | Tashiro | H01J 37/222 250/396 R |
| 2006/0284081 | A1 | 12/2006 | Miyamoto et al. | |
| 2007/0242133 | A1 * | 10/2007 | Ooki | G02B 21/365 348/79 |
| 2010/0224780 | A1 * | 9/2010 | Spruck | G02B 21/0004 250/309 |
| 2012/0025075 | A1 * | 2/2012 | Moore | G02B 21/002 250/307 |
| 2014/0291514 | A1 * | 10/2014 | Gong | G01N 21/88 250/310 |

OTHER PUBLICATIONS

Thiberge et al., "Scanning electron microscopy of cells and tissues under fully hydrated conditions", PNAS, vol. 101, No. 10, Mar. 9, 2004, pp. 3346-3351.
Ring et al., "Microfluidic System for Transmission Electron Microscopy", Microscopy and Microanalysis, vol. 16, 2010, pp. 622-629.
Nishiyama et al., "Atmospheric scanning electron microscope observes cells and tissues in open medium through silicon nitride film", Journal of Structural Biology, vol. 169, 2010, pp. 438-449.
Maruyama et al., "Immuno EM-OM correlatiye microscopy in solution by atmospheric scanning electron microscopy (ASEM)", Journal of Structural Biology, vol. 180, 2012, pp. 259-270.
Liv et al., "Scanning electron microscopy of individual nanoparticle bio-markers in liquid", Ultramicroscopy, vol. 143, 2014, pp. 93-99.
Klein et al., "Transmission electron microscopy with a liquid flow cell", Journal of Microscopy, vol. 242, No. 2, 2011, pp. 117-123.
International Preliminary Report on Patentability received for PCT Patent Application No. PCT/NL2015/050528, dated Feb. 9, 2017, 12 pages.
Dukes et al., "Correlative Fluorescence Microscopy and Scanning Transmission Electron Microscopy of Quantum-Dot-Labeled Proteins in Whole Cells in Liquid", American Chemical Society, vol. 4, No. 7, 2010, pp. 4110-4116.
International Search Report dated Dec. 17, 2015, PCT Application No. PCT/NL2015/050528.

* cited by examiner

METHOD FOR INSPECTING A SAMPLE USING AN ASSEMBLY COMPRISING A SCANNING ELECTRON MICROSCOPE AND A LIGHT MICROSCOPE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

The invention relates to a method for inspecting a sample using an assembly comprising a scanning electron microscope and a light microscope.

It is well known that electron microscopy offers nanometer-scale spatial resolution. However, when the material to be visualized is exposed to very high current densities, the imaging capabilities may be seriously limited.

On the one hand, local charging of insulating or weakly conductive materials causes imaging artefacts due to deflection of the primary imaging beam.

On the other hand, the presence of free charge carriers (electrons or possibly holes) may make the sample vulnerable to chemical reactions, such as decomposition due to bond breakage or reactions involving radical or ionized intermediates. Similarly, also the excitation of bound electrons to high energy, weakly bound states as a result of the cascade of energy dissipation reactions after electron beam irradiation, can lead to chemical modification.

Especially organic materials, such as biological material, polymers, and other soft matter, are for this reason hard to image by means of an electron microscope. However, also inorganic materials may be prone to electron-irradiation induced damage. And even for conducting materials, the decomposition of absorbed gas molecules present in the electron microscope vacuum chamber can modify the surface structure such that the imaging quality is negatively affected.

It is an object of the present invention to provide a method for imaging vulnerable and/or dynamic materials in an undamaged state or in a way that minimizes the chance for imaging artefacts or sample modification by non-invasive determination of regions of interest in-situ in the scanning electron microscope at very high spatial and temporal resolution. In addition or alternatively, it is an object of the present invention to provide a method to monitor sample damage during image scanning, and preferably to adjust the scan parameters during image acquisition based on information from the monitored sample damage.

SUMMARY OF THE INVENTION

According to a first aspect, the invention provides a method for inspecting a sample with an assembly comprising a scanning electron microscope and a light microscope, wherein the assembly comprises a sample holder for mounting a sample thereon, wherein the sample holder is arranged for inspecting the sample with both the scanning electron microscope and the light microscope, wherein the method comprising the steps of:

capturing a light microscopy image of the sample in its position for imaging with the scanning electron microscope;

determining a position and physical dimensions of a region of interest in the sample based on the light microscopy image;

determining values to which the scanning electron microscope parameters need to be set to image the sample on the sample holder at a desired resolution; and capturing a scanning electron microscope image of the region of interest in the sample, wherein the scan settings for recording the scanning electron microscope image are determined from said values and said position and physical dimensions of said region of interest.

The method of the present invention uses an assembly comprising a scanning electron microscope and a light microscope. An example of such an assembly is an integrated microscope, wherein another type of microscope, such as a light or a fluorescence microscope, is entirely integrated into the scanning electron microscope. This integration can be performed in such a way that the same area can be observed simultaneously with both the light microscope and the scanning electron microscope. In addition, the integrated light microscope may be of very high quality capable of taking images at the best resolution and highest magnification possible for light microscopy. Such a system is, for example, disclosed in WO 2012/008836 from Delmic B.V.

The present invention is based on the realization that such a system allows for highly accurate determination of regions of interest on the specimen, independent from the scanning electron microscope and in a non-invasive manner. The integrated light microscope can thus be used to locate an area on the sample where all focusing procedures for the scanning electron microscope can be carried out, giving a substantially full list of values at which the electron microscope needs to be set for imaging at the desired resolution.

The integrated microscope is used to determine the exact position and size of the region interest. Also the values to which the scanning electron microscope parameters need to be set to image the sample on the sample holder at a desired resolution are at least partially based on the light microscope image. The combination of the substantially full list of values at which the electron microscope needs to be set and the exact position and size of the region of interest, are used to precisely tune the scan settings of the electron microscope preferably before capturing the scanning electron microscope image of the region of interest.

According to the method of the invention, the scan settings for recording the scanning electron microscope image are determined or calculated from said values and said position and physical dimensions of the region of interest, prior to exposing said region of interest with the electron beam of the scanning electron microscope, and subsequently capturing a scanning electron microscope image of said region of interest. The method of the invention allows to capture a scanning electron microscope image of the region of interest without a prior electron beam exposure of said region of interest, and thus using a first electron beam exposure of said region of interest. The present invention thus provides a method for capturing a scanning electron microscope image of samples that are vulnerable to electron beam exposure.

It should be noted that the method of the invention can also be used for other than vulnerable samples, for example for a sample which is mounted on a substrate that charges during electron imaging, such as a glass substrate.

It is noted that for the inspection of a sample with an electron microscope, inter alia, the total dose deposited on an area of the sample is an important factor: the more energy is dissipated in the sample, the higher the chance for damage. One way to limit the chance for damage is to limit the dose on the area as much as possible. However, before inspection of an area with an electron microscope can be started, the electron beam needs to be finely focused and the sample has to be inspected at low magnification for sample navigation purposes and to identify regions of interest. When performing these actions in an electron microscope, a substantial initial dose may already be deposited which adversely effects subsequent high-resolution imaging of the initially unaffected sample.

In order to at least partially circumvent an initial dose, the present method comprises in an embodiment the step of determining the values to which the scanning electron microscope parameters need to be set to image the sample at a desired resolution, from a focusing area on the sample or on the sample holder. Said focusing procedures preferably provides a full list of values at which the electron microscope needs to be set for imaging at the desired resolution.

In an embodiment, the integrated light microscope is used to locate an area on the sample, further denoted herein as 'focusing area', where focusing procedures for the scanning electron microscope can be carried out. In an embodiment, the position of said focusing area in the sample is determined using the light microscope.

In an embodiment, the focusing area is located outside the region of interest, adjacent to the region of interest or at an edge of said region of interest. This allows to precisely tune the scan settings of the electron microscope in order to capture an electron microscope image of good quality with the first electron beam exposure of the region of interest. Preferably, said focusing area is located outside the region of interest. By performing the focusing procedure of the electron microscope outside the region of interest, an electron microscope image of the region of interest can be obtained without prior exposure of said region with an initial dose.

In addition or alternatively, the sample or the sample holder is equipped with a designated focusing area. A designated focusing area on the sample or sample holder is readily available for the focusing procedure, so there is no time needed for searching and/or selecting a proper focusing area.

In an embodiment, the focusing area contains features, also denoted herein as 'focusing markers', which features are arranged for retrieving the values needed to achieve a desired resolution. Thus the designated focusing area can be arranged for efficiently and/or quickly retrieving the scan settings of the electron microscope.

In a highly automated embodiment of the method of the invention, said position and physical dimensions of said region of interest and/or the position of said focusing area are determined by clicking pointers or drawing a rectangle on said light microscope image, in particular on the light microscope image as presented on a display screen of the assembly.

In an embodiment, the sample or the sample holder comprises coordinate markers that are used to convert a light microscopy coordinate system associated with an image from the light microscopy to an electron microscopy coordinate system associated with an image from the scanning electron microscope.

It is noted that there may be small differences between the images of a region as observed with the light microscope and with the scanning electron microscope. These small differences can, inter alia, arise from distortions in the microscopy systems or from a non-entirely parallel image plane of both microscopes. In such a case, the sample or sample holder is preferably equipped with coordinate markers that are observable in both the light microscope and the electron microscope. The images of these coordinate markers taken with both electron and light microscopes can then be used to determine a relation between the light microscopy coordinate system and the electron microscopy coordinate system. In an embodiment, the images of these coordinate markers are used to determine an equation to transform light microscopy image coordinates into electron microscopy image coordinates.

In an embodiment, the markers are not physically present on the sample or the sample holder, but are generated by exposing the sample or sample holder with the electron beam from the electron microscope so as to generate cathodoluminescence light. Coordinate markers are generated by exposing an area or multiple positions within an area on the sample with the electron beam so as to generate cathodoluminescence light that is detected by the light microscope. Detection of this light by the light microscopy is used to obtain the equation describing the coordinate transformation between the electron microscope image and the light microscope image.

It is further noted that it may not necessarily be only the total dose per area that determines when sample degradation starts to occur. The dose rate per area can also play an important role, in particular when there are other, non-damaging relaxation processes available to get rid of the excess energy or excess charge, the most obvious of which is conduction. When the areal dose rate of electrons on the sample is higher than the sum of the relaxation rates of said non-damaging relaxation processes, accumulation of charge in or on the sample and/or excited energy states of molecules in the sample occurs. For such a sample, an areal dose rate threshold can be defined, above which threshold the sample starts showing charging artefacts, or above which threshold the chance for sample damage significantly increases. In the latter case one can for instance think of the addition of excess energy to an already weakly bound or radicalized molecular state which helps a molecule over the remaining barrier for decomposition.

In an embodiment, the image from the region of interest is captured by integrating multiple sequential scans of the region of interest, preferably using a lower dose rate per area for each sequential scan. Using this multiple sequential scanning, instead of one single scan using a high dose rate per area, provides a way to effectively lower the dose rate per area to which the region of interest is exposed in each individual scan. The region of interest is exposed to a low dose electron beam during multiple sequential scans for capturing the electron microscope image.

In an embodiment, the scanning of the region of interest for capturing of the scanning electron microscope image is performed by interlaced scanning of scan lines in the area of interest. Using this interlaced scanning, instead of one single scan using a high dose rate per area, provides a way to effectively lower the dose rate per area to which the region of interest is exposed in each individual scan. Using the interlaced scanning, the electron microscope image can be captured using the first electron beam exposure of each scan line in the region of interest.

In addition or alternatively, the scanning of the region of interest for capturing of the scanning electron microscope image is provided with wait time, which is preferably arranged to provide sufficient time for the non-damaging relaxation processes. Preferably said non-damaging relaxation processes are arranged to take away energy from the sample which is induced by the irradiation of the sample by the electron beam of the electron microscope. In effect, due to said wait time, the areal dose is delivered during a longer time period, and thus the areal dose rate is lowered.

In a further embodiment, the integrated light microscope is used to monitor the sample during the capturing of the scanning electron microscope image, preferably during the first electron beam exposure of said region of interest. In an embodiment, the integrated light microscope is used to monitor the sample at an intermediate point in time, or during said wait time during the electron beam exposure, preferably said first electron beam exposure of the region of interest.

In an embodiment, this monitoring is used to evaluate the sample and whether or not any damage is being done to the sample. When such damage or an onset for damage is detected by the light microscope, measures can be initiated to circumvent or reduce further damage. An example of such a measure is the introduction of a wait time in the procedure for capturing the electron microscope image.

In an embodiment, the electron beam exposure of the sample is monitored by observing the fluorescence light from indicators, such as fluorescent dyes or colloidal quantum dots, using said light microscope. Preferably indicators are used which stop emitting fluorescence light when they are exposed to a certain dose or with a certain dose rate. When the light microscope observes a reduction in the emitted fluorescence light from a certain spot in the sample or sample holder, this may be an indication that the deposited dose or the chosen dose rate is too high.

In an embodiment, the observation of the indicators by the light microscope is used to establish a feedback to the electron microscope. In an embodiment said feedback is arranged for adjusting the scanning procedure of the electron beam exposure for capturing the electron microscope image, to minimize further damage to the sample. In an embodiment said feedback is arranged for adjusting the scanning procedure 'on the fly'; thus during said first electron beam exposure of the region of interest. Stable fluorophores, such as the quantum dots, may even turn on again after dissipation of local charges. This switching on and off of such indicators may be used as a sign to pause and restart image acquisition or to adjust the scanning procedure in another way.

In an embodiment, the scanning electron microscope parameters are adjusted during the electron beam scanning of the first pixels or lines of the image of the region of interest. This allows to substantially prevent any damaging of the remaining part of the region of interest and thus to obtain an image of the region of interest, in particular an image of a substantially intact sample.

In an embodiment, the light microscope is used to monitor the sample in time so as to follow dynamics in the sample, in particular to monitor the sample and watch for changes in light microscope image of the sample, preferably as a function of time. In an embodiment such dynamics comprises the occurrence of a change in the light microscope image due to damage or the onset of damage to the sample due to the irradiation by the electron beam of the electron microscope.

In an embodiment, the method comprises the additional steps of:

recording fluorescence images during the scanning of the electron beam of the scanning electron microscope over the region of interest in the sample for capturing the scanning electron microscope image, to monitor for damage or to monitor indicators, and adjusting the scanning electron microscope parameters during said scanning of the electron beam based on information from the recorded fluorescence images.

In a further embodiment, the scanning electron microscope is arranged to hold and observe samples in liquid or under atmospheric conditions. In an embodiment, the sample is arranged in a vacuum-tight capsule which comprises one or more thin membranes that are virtually or substantially transparent for electrons and through which the scanning electron imaging can be done.

Preferably, the positions of these membranes are known with respect to markers on the sample. Alternatively, the positions of the membranes, preferably with respect to markers on the sample, are determined from an image of the light microscope.

In an embodiment, the capsule is provided with the 'focusing markers' mentioned earlier. In addition or alternatively, a designated focusing membrane of the total set of membranes of the vacuum-tight capsule is used for finding the focusing settings.

Alternatively or additionally, the integrated secondary imaging system, in particular the light microscope, is used to obtain an image of the sample under the membrane areas and select the regions of interest within the membrane areas. In case the sample is a living sample, or a dynamic sample, for example biological materials or a solution containing nanoparticles, the integrated light microscope can be used to monitor the position of the region of interest in time and also determine the exact starting time for a first electron beam exposure of said region of interest for capturing the scanning electron microscope image of the region of interest.

In a further embodiment, the capsule containing the liquid is connected to one or more reservoirs. Said capsule and reservoirs are arranged to establish a flow of liquid at the location of the sample, for example using microfluidics. This flow provides a means for removing damaging species generated in the liquid as a result of the impinging electron beam. Said damaging species comprises, for example, solvated electrons, ionized or radical water species, or reactive components resulting from water or other liquid decomposition.

In an embodiment, the reservoir holds a liquid containing scavenger species, in particular scavenger molecules, that can prevent reactive species generated by the electron beam in the liquid from reacting with the sample. The flow may serve to introduce scavenger molecules, such as vitamins, into the capsule. These scavenger molecules are arranged or selected to quickly react with the reactive species generated by the electron beam. Inside the capsule, the scavenger molecules thus prevent or minimize damaging reactions of the reactive species with the sample.

Preferably, said scavenger molecules are introduced into the vacuum-tight capsule or are present in the sample, only when the sample is scanned by the electron beam. Thus when the sample is not being scanned by the electron beam, said sample is arranged in a non-flow condition and/or without the scavenger molecules present.

In an embodiment, the flow is synchronized with the electron beam scanning for capturing the scanning electron microscope image of the region of interest, in particular to further minimize the damaging effects of the first electron beam exposure of said region of interest. In an embodiment, the flow is substantially stopped when the sample is not being scanned by the electron beam of the scanning electron microscope.

In an embodiment, the light microscope is used to identify the starting and/or stop time for capturing of the scanning electron microscope image of the region of interest. For example, the light microscope is used to establish when the region of interest is at a suitable position to be scanned by the electron beam of the scanning electron microscope. In addition or alternatively, the capturing of the scanning electron microscope image is started when no signs of damage are detected by the light microscope, for example at the focusing area. In addition or alternatively, the capturing of the scanning electron microscope image is stopped when the light microscope detects signs of damage or signs for an onset of damage on the sample.

In an embodiment, the sample is monitored with the light microscope during the capture of the scanning electron microscope image of the region of interest, wherein information obtained with the light microscope is used to adjust the scan settings for capturing the scanning electron microscope image of the region of interest during the scan and/or to control the flow from the reservoirs in case of a sample in liquid.

In an embodiment, markers are contained in the sample that can be observed with the light microscope, wherein changes in a signal observed from said markers with said light microscope are used to adjust said scan setting and/or to control said flow in case of a sample in liquid.

In an embodiment, said markers emit fluorescence light and the intensity of said fluorescence light is dependent on the dose and/or the dose rate deposited by the scanning electron microscope.

According to a second aspect, the present invention provides a computer program having instructions adapted to perform the method as described above, in particular with or without any of the embodiments described above.

According to a third aspect, the present invention provides a computer readable medium, having recorded thereon a computer program as described above.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
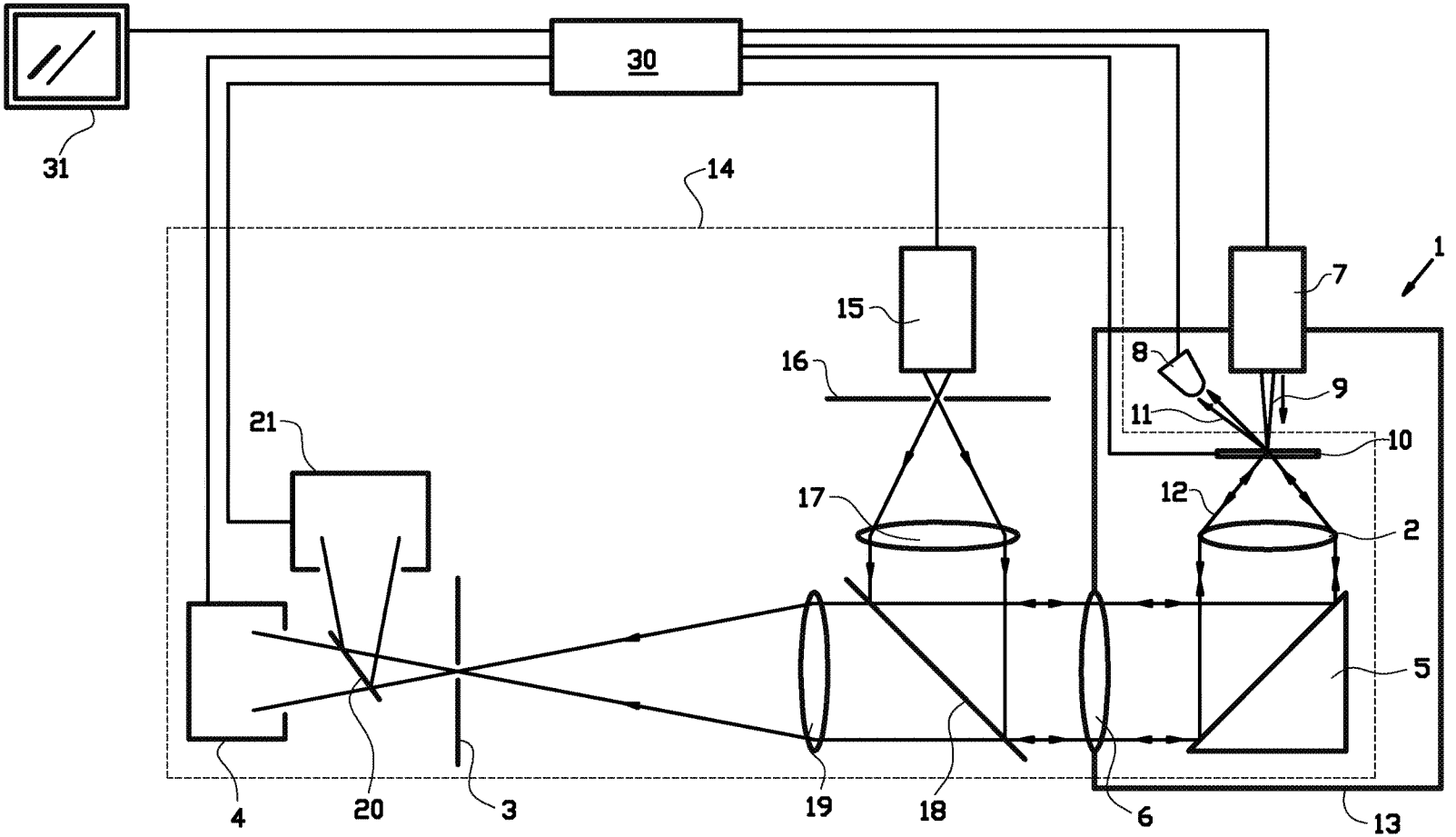
FIGS. 1 and 2 schematically depict a basic design of an apparatus as typically used by the method of the present invention.

By way of example, a typical set up for performing the method of the present invention is shown in FIG. 1. FIG. 1 shows a so-called optical SEM combination. It comprises an assembly of at least a light microscope 2, 3, 4 and an electron microscope 7, 8. This example however by no means excludes any known or yet unknown variation or alternative thereof.

FIG. 1 schematically represents the inspection apparatus 1, which is provided with a light source 15 (for instance a laser) and ancillary means for directing light from the light source 15 to the sample holder 10 for irradiating an illumination region of the sample on said sample holder 10. In the following discussion use will be made of a laser source 15 as a light source, but other light sources may also be applied.

The ancillary means for directing the light of the laser source 15 to the sample holder 10 comprises a pinhole 16, a collimating lens 17, and a dichroic mirror 18 to project the light from the laser source 15 into the beam path of the optical microscope 2, 3, 4. The light from the laser source 15 then traverses through the optical window 6 of a vacuum chamber 13, is redirected towards the sample holder 10 by a mirror 5 and is focused onto the sample by an objective lens 2 in order to irradiate an illumination region of the sample.

Any reflected light and/or emitted luminescence or fluorescence light in response to the irradiation of the sample with light from the laser source 15, is collected and detected by the optical microscope 2, 3, 4. It is noted that the reflected and/or fluorescence light 12 and the light from the laser source 15 travel in the opposite directions in the beam path of the optical microscope. The optical microscope 2, 3, 4 is equipped with a light collecting device to receive in use the light 12 from the sample on the sample holder 10 and to focus it on a photon-detector 4. The light collecting device as shown in FIG. 1 comprises an objective lens 2, however also a mirror or a glass fibre can be used as a light collecting device. The light 12 from the sample holder 10 travels back and exits the vacuum chamber 13 through the optical window 6. After passing the dichroic mirror 18 and the lens 19, the luminescence light passes the pinhole 3 and arrives at the photon-detector 4. Optionally a beam splitter 20 may be applied in combination with a spectrometer 21 for further analysis. Other or multiple detection paths may also be used.

In the present example the optical microscope 2, 3, 4 is of an confocal type having a pinhole 3 which is arranged in a conjugate plane of the sample on the sample holder 10, between the objective lens 2 and the photon detector 4.

In addition, the inspection apparatus 1 comprises an electron microscope 7, 8 comprises a source 7 for emitting a primary electron beam 9 to the sample, which is preferably arranged in or on the sample holder 10. Preferably the electron microscope is a scanning electron microscope and the source 7 comprises a scanner for scanning the primary electron beam 9 over the surface of the sample on the sample holder 10. In addition, the sample holder 10 is provided with actuators (not shown in detail) for manipulating and/or positioning the sample holder 10 with the sample with respect to the optical microscope 2, 3, 4 and the electron microscope 7, 8. Such actuators are well known by the person skilled in the art, and a detailed illustration of the actuators is omitted in the schematic drawing of FIG. 1.

The electron microscope further comprises a detector 8 for detecting:

charged particles 11 which are scattered back from the sample 10, or emitted, or scattered secondary charged particles or radiation from the sample 10 which are induced by the primary beam 9.

As schematically shown in FIG. 1, the electron microscope 7,8 is substantially arranged inside a vacuum chamber 13. The optical microscope 2, 3, 4 is placed partially inside and partially outside said vacuum chamber 13. The dashed line 14 encircles those parts of the inspection apparatus 1 of the invention which all or some may be mounted on a (replaceable) door of the vacuum chamber 13. In particular, the sample holder for the sample 10, the light collecting device 2, the optional pinhole 3, and the photon-detector 4, are preferably mounted on said door of the vacuum chamber 13. Preferably this also entails the laser source 15 and the ancillary means that are used as explained above for directing light to the sample 10 and excite it to emit luminescence light which is detectable by the optical microscope. This particular construction enables an easy retrofit or completion of an existing electron microscope according to prior art in order to convert it into an inspection apparatus according of the integrated type as used in the present invention.

In FIG. 1, a processing unit 30, alternatively denoted controller, is provided and useable as an automation unit, e.g. in the form of a computer, including a personal computer provided with dedicated software, implementing one or more methods of use of the inspection apparatus, including the method of the present invention, with or without one or more of the embodiments described above. The controller 30 is, inter alia, used to control the working of the scanning electron microscope 7, 8, the movement of sample holder 10, and the optical microscope 2, 3, 4, and is provided with a computer program having instructions adapted to construct an image from the optical microscope 2, 3, 4 and/or the scanning electron microscope 7, 8.

The controller 30 may typically be provided with one or more screens 31, e.g. one screen or screen part for depicting an optical image as recorded via the light microscope, and another screen or another part of the same screen depicting an electron image as recorded via the scanning electron microscope part of the inspection apparatus.

Figure 2:
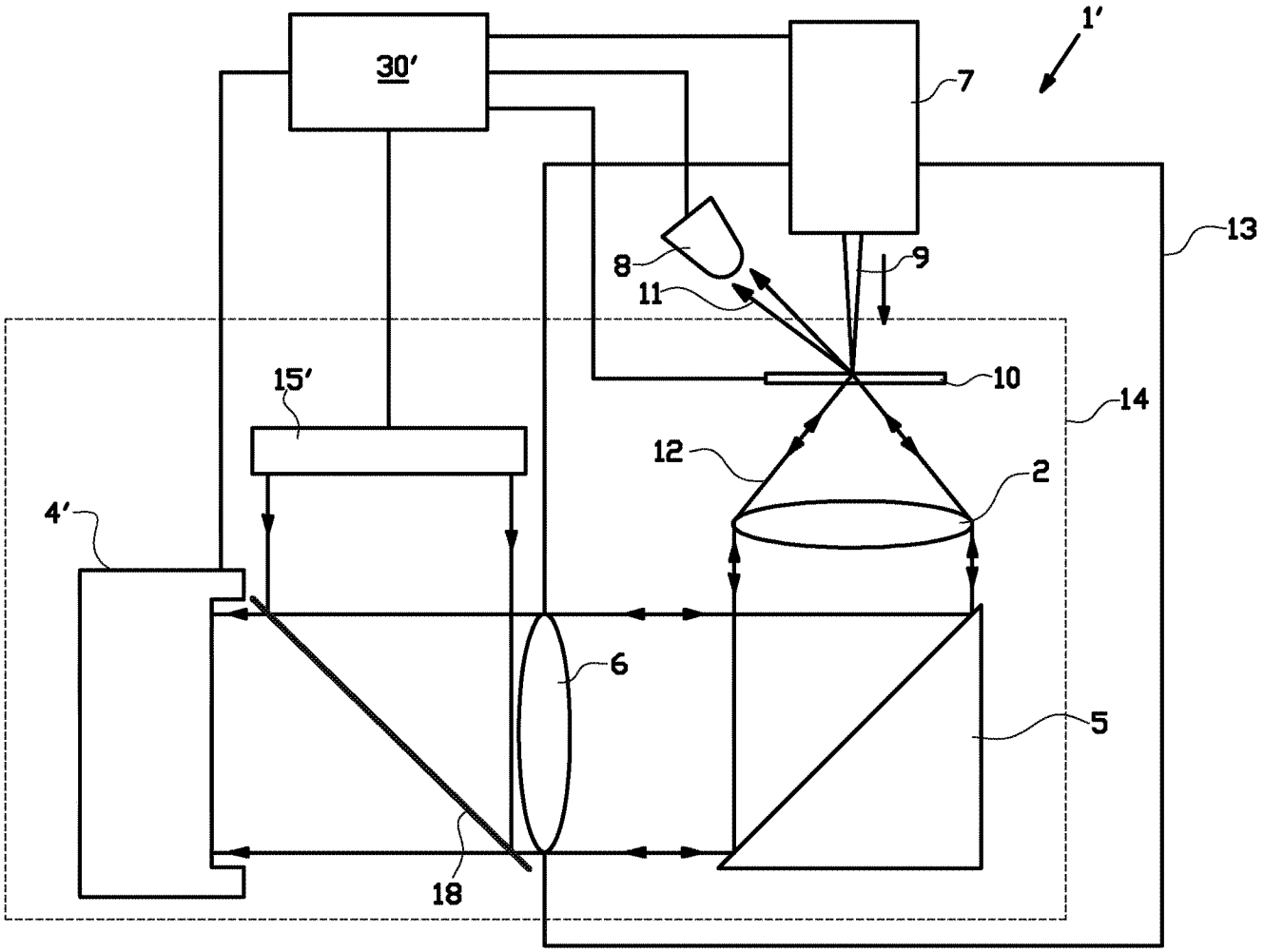

In a second example, as shown in FIG. 2, the inspection apparatus 1' comprises a light source 15' for illuminating an area of the sample 10, and a camera 4' for collecting an image, also denoted a wide field image, of the illuminated area of the sample 10. The camera 4' is for example a CCD camera which can be controlled by the controller 30', which also controls the charged particle microscope 7, 8, the movement of the sample holder 10, and the light source 15'.

It is noted that the features in the second example as depicted in FIG. 2, which correspond to the same features as already described with reference to the first example, have been provided with the same reference numbers as in FIG. 1.

Both the assemblies as shown in FIGS. 1 and 2 are suitably arranged for studying the same sample by means of an electron microscope and a light microscope, in particular for studying the same part of the sample by means of said electron microscope and said light microscope.

As already discussed above, electron microscopy offers nanometer-scale spatial resolution, but the fact that the material to be visualized is exposed to very high current densities may seriously limit the imaging capabilities, for example due to local charging, and/or may modify the surface of vulnerable samples. The occurrence of local charging and/or surface modification depends on the sample to be studied, and negatively affects the imaging quality.

In particular, the scanning strategy may determine whether or not detrimental effects start to occur in a sample and/or an image. The scanning strategy, for example, comprises one or more of a pixel dwell time, pixel size, wait time between pixels, interlaced scanning, integration of multiple images obtained using a low dose rate (as opposed to taking a single image using a high dose rate). The appropriate conditions for selecting a suitable scanning strategy can be known on forehand through knowledge of the sample under investigation. Alternatively, the scanning strategy may be determined on the same area as where the procedure for finding the correct focus settings is carried out.

Both of the above mentioned procedures require knowledge of the sample under investigation, in particular of the location of regions of interest, and in the second case, of the precise size of this region of interest. Thus, a prior image, or 'navigation map' of the specimen is needed.

As the scanning electron microscope has a very large field of view (several mm's), a low-magnification overview of the sample can be made using said scanning electron microscope. For this image the dose on the exposed area is equivalently very low and may well be below the thresholds over which sample damage, charging or other artefacts become noticeable in subsequent images. Thus, from this low-magnification image, the area for fine focusing the microscope and finding the needed microscope settings can be determined. Also, the region(s) of interest can be identified from this low-magnification image and thus this image may serve as the navigation map to move between the different regions of interest that are then imaged without further prior exposure.

However, for very vulnerable samples the first exposure may already be deteriorating, and from the low magnification image, determination of region of interest size and position may not be accurate enough to determine an optimized scanning strategy. The present invention provides a method for obtaining a suitable image from a region of interest using the first exposure of said region of interest by the electron beam of the electron microscope. The method of the present invention is highly suitable for imaging vulnerable samples, but can also be employed for other samples.

Figure 3:
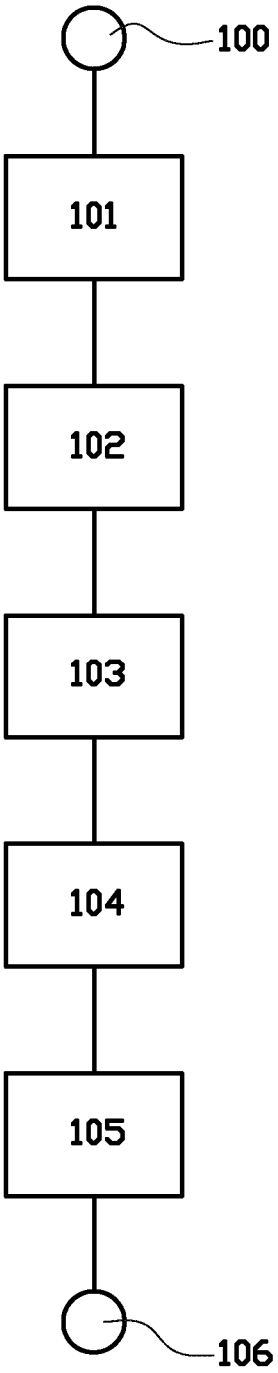
FIGS. 3, 4 and 5 schematically depict a block diagram showing various examples of a method according to the present invention.

A first example of the method of the invention is schematically depicted in FIG. 3. The procedure is started 100 after mounting a sample in the inspection apparatus in such a way that it can be observed with both the scanning electron microscope and the light microscope.

Subsequently in a first step 101, one or more values to which the scanning electron microscope parameters need to be set to image the sample on the sample holder at a desired resolution, are determined. This is for example established by making a list of the values to which the scanning electron microscope needs to be set to image the sample at the required resolution. Preferably, the values to which the scanning electron microscope parameters need to be set to image the sample on the sample holder at a desired resolution are at least partially based on a measurement or image of the sample as taken by the light microscope.

In addition or alternatively, the values to which the scanning electron microscope parameters need to be set are determined during a focusing procedure which is carried out on a focusing area on the sample or on the sample holder. Said focusing procedure preferably is arranged to provide a full list of values at which the electron microscope needs to be set for imaging at the desired resolution. This focusing procedure is for example carried out on a dedicated focusing area on the sample or on the sample holder 10, which dedicated focusing area is arranged for retrieving the values needed to achieve the desired resolution, for example by using focusing markers arranged at said dedicated focusing area.

In a second step 102, a light microscopy image of the sample in its position for imaging with the scanning electron microscope is captured. This is for example established by capturing a fluorescence image while the sample is in position in the electron microscope.

In a third step 103, a position and physical dimensions of a region of interest in the sample is determined based on the light microscopy image. This is for example established by determining the position and lateral dimensions of the region of interest for electron microscopy from the fluorescence image.

In a fourth step 104, the scan settings for recording the scanning electron microscope image are set using the values from the first step 101 and the position and physical dimensions of the region of interest from the third step 103.

In a fifth step 105, the region of interest on the sample is scanned by the electron beam for the first time for capturing a scanning electron microscope image of the region of interest. Thus, the scanning electron microscope image of the region of interest is captured without prior exposure of said region of interest, and the procedure is stopped 106.

In a second example of a method of the invention, the sequence of the first three steps of the first example of the method of the invention is changed and also content of these steps is modified as follows, with reference again to FIG. 3:

In a first step 101, a light microscopy image of the sample in its position for imaging with the scanning electron microscope is captured. This is for example established by capturing a fluorescence image while the sample is in position in the electron microscope.

In a second step 102, a position and physical dimensions of a region of interest in the sample is determined based on the light microscopy image. This is for example established by determining the position and lateral dimensions of the region of interest for electron microscopy from the fluorescence image.

In a third step 103, the position of said focusing area in the sample is determined using the light microscopy image. For example, the focusing area can be arranged or selected to be located outside the region of interest, adjacent to the region of interest, or at an edge of said region of interest as determined in the second step 102. The focusing procedure is carried out on the focusing area on the sample as determined using the light microscope.

In a fourth step 104, the scan settings for recording the scanning electron microscope image are set using the position and physical dimensions of the region of interest from the second step 102, and the values from the third step 103.

In a fifth step 105, the region of interest on the sample is scanned by the electron beam for the first time for capturing a scanning electron microscope image of the region of interest. Thus, the scanning electron microscope image of the region of interest is captured without prior exposure of said region of interest, and the procedure is stopped 106.

Figure 4:
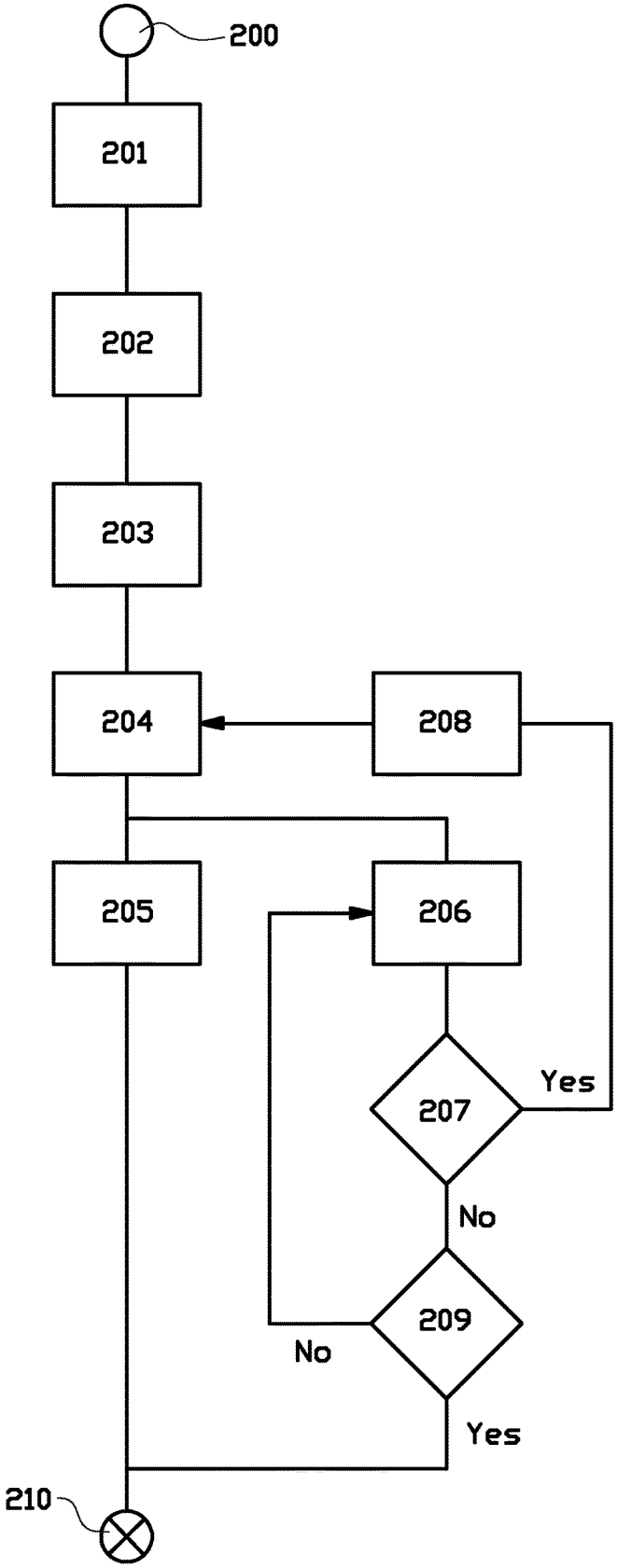

In a third example of a method of the invention as presented in FIG. 4, the first step 201, the second step 202, the third step 203, the fourth step 204 and the fifth step 205 after the start 200, are essentially the same as in the first or second example as described above with reference to FIG. 3.

In this third example, during the fifth step 205, the sample is monitored with the light microscope by recording a light microscope image in a sixth step 206, and the image is analyzed to identify any damage to the sample in the seventh step 207.

When this image shows any signs of damage to the sample, the scan settings are adjusted in an adjustment step 208, which adjusted scan settings are introduced in the fourth step 204 in order to set the scan settings for recording the scanning electron microscope image to the adjusted scan settings.

When the image does not show any signs for damage, the method proceeds to establish in a subsequent step 209 whether or not the scanning of the region of interest for capturing 205 the scanning electron microscopy image is completed. When the scanning is not completed, the procedure will go back to the sixth step 206 for again recording a light microscopy image. When the scanning is completed the procedure, including the monitoring of the sample, is stopped 210.

Figure 5:
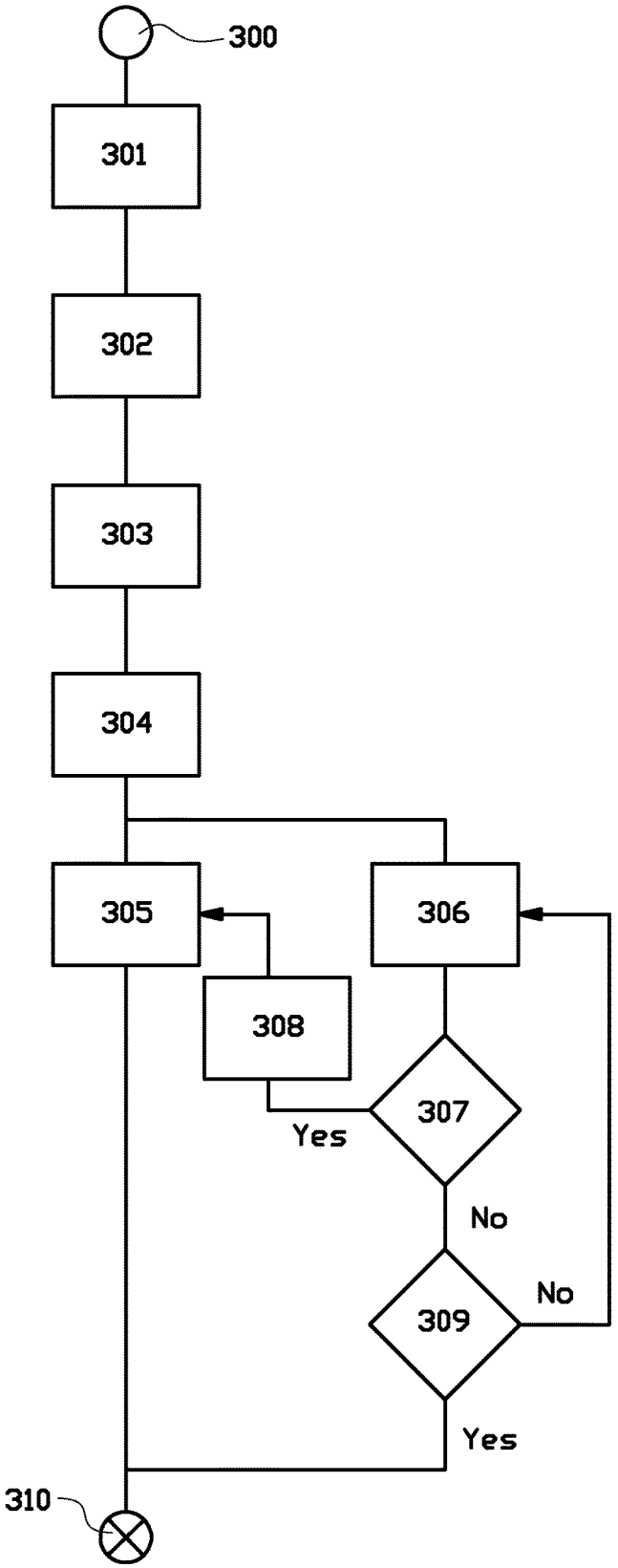

In a fourth example of a method of the invention as presented in FIG. 5, the first step 301, the second step 302, the third step 303, the fourth step 304, and the fifth step 305 after the start 300, are essentially the same as in the first or second example as described above with reference to FIG. 3.

In this fourth example, during the fifth step 305, the sample is monitored with the light microscope by recording a light microscope image in a sixth step 306, and the image is analyzed to identify any damage to the sample in the seventh step 307.

When this image shows any signs of damage to the sample, the capturing of the image (step 305) is at least temporarily interrupted, for example by introducing a wait time. When the wait time has lapsed, the capturing of the image 305 and the monitoring of the sample with the light microscope 306 is resumed.

When the image does not show any signs for damage, the method proceeds to establish in a subsequent step 309 whether or not the scanning of the region of interest for capturing 305 the scanning electron microscopy image is completed. When the scanning is not completed, the procedure will go back to the sixth step 306 for again recording a light microscopy image. When the scanning is completed, the procedure, including the monitoring of the sample, is stopped 310.

In addition or alternatively, the sample is also monitored sample with the light microscope 306 during the wait time.

The focusing procedure on a focusing area on the sample, according to any of the examples above, can also be used to investigate the vulnerability of the sample to electron beam exposure and/or the establish a threshold for the total dose, and/or an dose rate threshold, above which threshold(s) the sample starts showing charging artefacts, or above which threshold(s) the chance for sample damage significantly increases. The threshold is for example established by irradiating the focusing area by the electron beam of the electron microscope and recording the total dose or the areal dose rate at which any damage or onset for damage is observed by the light microscope, for example using indicators as described in more detail above. The threshold value(s) are for example used to select a proper procedure to capture the electron microscope image of the region of interest. For example the procedure is amended to use one or more of the following procedures comprising:

- obtaining multiple sequential scans of the region of interest using a low areal dose rate, and integrating the multiple scans to form an image;
- using interlaced scanning of scan lines in the region of interest;
- providing the scanning procedure for capturing the electron microscope image with wait time.

The focusing procedure on a focusing area on the sample, according to any one of the previous examples, can also be used to observe coordinate markers which are observable in both the light microscope and the electron microscope. The images of these coordinate markers taken with both electron and light microscopes are used to determine a relation between the light microscopy coordinate system and the electron microscopy coordinate system. In particular, the images of these coordinate markers are used to determine an equation to transform light microscopy image coordinates into electron microscopy image coordinates.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the present invention provides a method for inspecting a sample with an assembly comprising a scanning electron microscope (SEM) and a light microscope (LM). The assembly comprises a sample holder for holding the sample. The sample holder is arranged for inspecting the sample with both the SEM and the LM, preferably at the same time. The method comprising the steps of:

capturing a LM image of the sample in its position for imaging with the SEM;

determining a position and dimensions of a region of interest in or on the sample using the LM image;

determining values to which the SEM parameters need to be set to image the sample at a desired resolution; and capturing a SEM image of the region of interest, preferably using the first electron beam exposure of said region of interest.

The invention claimed is:

1. [Method] *A method* for inspecting a sample with an assembly comprising a [scanning electron] *charged particle* microscope and a light microscope, wherein the assembly comprises a sample holder for mounting a sample thereon, wherein the sample holder is arranged for inspecting the sample with both the [scanning electron] *charged particle* microscope and the light microscope, [wherein] the method comprising the steps of:

capturing a light microscopy image of the sample in its position for imaging with the [scanning electron] *charged particle* microscope, *the light microscopy image being captured using an optical microscope objective lens of the light microscope*;

determining a position and physical dimensions of a region of interest in the sample based on the light microscopy image;

determining values to which the [scanning electron] *charged particle* microscope parameters need to be set to image the sample on the sample holder at a desired resolution, wherein said values to image the sample on the sample holder at the desired resolution are at least partially based on the light microscope image; and capturing a [scanning electron] *charged particle* microscope image of the region of interest in the sample, wherein the scan settings for recording the [scanning electron] *charged particle* microscope image are determined from said values and said position and physical dimensions of said region of interest before the [scanning electron] *charged particle* microscope image is captured, wherein the [scanning electron] *charged particle* microscope image of the region of interest is captured using a first [electron] *charged particle* beam exposure of said region of interest.

2. [Method] *The method* according to claim 1, wherein the values to which the [scanning electron] *charged particle* microscope parameters need to be set to image the sample at a desired resolution, is obtained from a focusing area on the sample or on the sample holder.

3. [Method] *The method* according to claim 2, wherein the position of said focusing area is determined using the light microscope.

4. [Method] *The method* according to claim 2, wherein the focusing area is located outside the region of interest, adjacent to the region of interest, or at an edge of said region of interest.

5. [Method] *The method* according to claim 2, wherein the sample or the sample holder is equipped with a designated focusing area.

6. [Method] *The method* according to claim 2, wherein the focusing area contains focusing markers, which focusing markers are arranged for retrieving the values needed to achieve a desired resolution.

7. [Method] *The method* according to claim 1, wherein said position and physical dimensions of said region of interest and/or the position of said focusing area, are determined by clicking pointers or drawing a rectangle on said light microscope image, in particular on the light microscope image as presented on a display screen of the assembly.

8. [Method] *The method* according to claim 1, wherein the sample or the sample holder comprises coordinate markers that are used to convert a light microscopy coordinate system associated with an image from the light microscopy to [an electron] *a charge particle* charge particle microscopy coordinate system associated with an image from the [scanning electron] *charged particle* microscope.

9. [Method] *The method* according to claim 8, wherein images of the coordinate markers are used to determine an equation to transform light microscopy image coordinates into [electron] *charged particle* microscopy image coordinates.

10. [Method] *The method* according to claim 8, wherein said coordinate markers are generated by exposing an area or multiple positions within an area on the sample or sample holder with the [electron] *charged particle* beam from the [electron] *charged particle* microscope so as to generate cathodoluminescence light that is detected by the light microscope.

11. [Method] *The method* according to claim 1, wherein the [electron] *charged particle* microscope image from the region of interest is captured by integrating multiple sequential scans of the region of interest and/or by interlaced scanning of scan lines in the region of interest.

12. [Method] *The method* according to claim 1, wherein the scanning of the region of interest for capturing of the [electron] *charged particle* microscope image is provided with wait time, which is arranged to provide sufficient time for non-damaging relaxation processes to take away energy from the sample which is induced by the irradiation of the sample by the [electron] *charged particle* beam of the [electron] *charged particle* microscope.

13. [Method] *The method* according to claim 1, wherein the integrated light microscope is used to monitor the sample during the capturing of the [electron] *charged particle* microscope image.

14. [Method] *The method* according to claim 13, wherein the monitoring comprises an evaluation of whether or not any damage is detected by the light microscope.

15. [Method] *The method* according to claim 13, wherein the [electron] *charged particle* beam exposure of the sample is monitored by observing the fluorescence light from indicators using said light microscope.

16. [Method] *The method* according to claim 15, wherein said indicators are arranged or are selected to stop emitting fluorescence light when they are exposed to a predetermined dose, or are exposed with a predetermined dose rate.

17. [Method] *The method* according to claim 15, wherein the observation of the indicators by the light microscope is used to establish a feedback to the [electron] *charged particle* microscope, wherein said feedback is arranged for adjusting the scanning procedure of the [electron] *charged particle* beam exposure to minimize further damage to the sample.

18. [Method] *The method* according to claim 1, wherein the [electron] *charged particle* microscope parameters are adjusted during the [electron] *charged particle* beam scanning of first pixels or lines of the image of the region of interest.

19. [Method] *The method* according to claim 1, wherein the light microscope is used to monitor the sample in time so as to follow dynamics in the sample, or to monitor the sample and watch for changes in light microscope image of the sample as a function of time.

20. [Method] *The method* according to claim 1, wherein the method comprises the additional steps of:

recording fluorescence images during the scanning of the [electron] *charged particle* beam of the [scanning electron] *charged particle* microscope over the region of interest in the sample for capturing the [scanning electron] *charged particle* microscope image, to monitor for damage or to monitor for changes in the fluorescent light of the indicators, and adjusting the [scanning electron] *charged particle* microscope parameters during said scanning of the [electron] *charged particle* beam based on information from the recorded fluorescence images.

21. [Method] *The method* according to claim 1, wherein the sample is arranged in a vacuum-tight capsule which comprises one or more thin membranes that are substantially transparent for [electrons] *charged particles* and through which the [scanning electron] *charged particle* imaging can be done.

22. [Method] *The method* according to claim 21, wherein the vacuum-tight capsule comprises a focusing area, and wherein the focusing area contains focusing markers, which focusing markers are arranged for retrieving the values needed to achieve a desired resolution.

23. [Method] *The method* according to claim 21, wherein said one or more thin membranes comprises a focusing membrane, wherein said focusing membrane is used for finding the focusing settings.

24. [Method] *The method* according to claim 21, wherein the light microscope is used to obtain an image of the sample under the membrane areas and to select the regions of interest within the membrane areas.

25. [Method] *The method* according to claim 21, wherein the vacuum- tight capsule is connected to one or more reservoirs for liquid, wherein said capsule and reservoirs are arranged to establish a flow of liquid at the location of the sample.

26. [Method] *The method* according to claim 25, wherein at least one of said one or more reservoir holds a liquid containing scavenger species, in particular scavenger molecules[, such as] *or scavenger molecules that include* vitamin molecules.

27. [Method] *The method* according to claim 26, wherein said scavenger species are introduced into the vacuum-tight capsule or are present in the sample only when the sample is scanned by the [electron] *charged particle* beam.

28. [Method] *The method* according to claim 25, wherein the flow of liquid is synchronized with the [electron] *charged particle* beam scanning for capturing the [scanning electron] *charged particle* microscope image of the region of interest, or wherein the flow of liquid is substantially stopped when the sample is not being scanned by the [electron] *charged particle* beam.

29. [Method] *The method* according to claim 1, wherein the light microscope is used to identify the starting and/or stop time for capturing of the [scanning electron] *charged particle* microscope image of the region of interest.

30. [Method] *The method* according to claim 1, wherein the sample is monitored with the light microscope during the capture of the [scanning electron] *charged particle* microscope image of the region of interest, wherein information obtained with the light microscope is used to adjust the scan settings for capturing the [scanning electron] *charged particle* microscope image of the region of interest during the scan and/or to control the flow from the reservoirs.

31. [Method] *The method* according to claim 1, wherein the sample comprises markers that can be observed with the light microscope, wherein changes in the observed markers with said light microscope are used to adjust said scan settings.

32. [Method] *The method* according to claim 31, wherein said markers are arranged to emit fluorescence light, and wherein the intensity of said fluorescence light is dependent on the dose and/or the dose rate deposited by the [scanning electron] *charged particle* microscope.

33. [Assembly] *An assembly* comprising a light microscope and [an electron] *a charged particle* microscope, wherein the assembly comprises a processing unit, wherein the processing unit is provided with a computer program having instructions adapted to perform a method for inspecting a sample with the assembly, wherein the assembly comprises a sample holder for mounting a sample thereon, wherein the sample holder is arranged for inspecting the sample with both the [scanning electron] *charged particle* microscope and the light microscope, [wherein] the method [comprises] *comprising* the steps of:

capturing a light microscopy image of the sample in its position for imaging with the [scanning electron] *charged particle* microscope, *the light microscopy image being captured using an optical microscope objective lens of the light microscope*;

determining a position and physical dimensions of a region of interest in the sample based on the light microscopy image;

determining values to which the [scanning electron] *charged particle* microscope parameters need to be set to image the sample on the sample holder at a desired resolution, wherein said values are at least partially based on the light microscope image; and capturing a [scanning electron] *charged particle* microscope image of the region of interest in the sample, wherein the scan settings for recording the [scanning electron] *charged particle* microscope image are determined from said values and said position and physical dimensions of said region of interest before the [scanning electron] *charged particle* microscope image is captured.

34. A non-transitory computer readable medium, having recorded thereon a computer program which, when provided on a processing unit of an assembly comprising a light microscope and [an electron] *a charged particle* microscope, said computer program has instructions to perform a method for inspecting a sample with the assembly, wherein the assembly comprises a sample holder for mounting a sample thereon, wherein the sample holder is arranged for inspecting the sample with both the [scanning electron] *charged particle* microscope and the light microscope, [wherein] the method [comprises] *comprising* the steps of:

capturing a light microscopy image of the sample in its position for imaging with the [scanning electron] *charged particle* microscope*, the light microscopy image being captured using an optical microscope objective lens of the light microscope*;

determining a position and physical dimensions of a region of interest in the sample based on the light microscopy image;

determining values to which the [scanning electron] *charged particle* microscope parameters need to be set to image the sample on the sample holder at a desired resolution, wherein said values are at least partially based on the light microscope image; and capturing a [scanning electron] *charged particle* microscope image of the region of interest in the sample, wherein the scan settings for recording the [scanning electron] *charged particle* microscope image are determined from said values and said position and physical dimensions of said region of interest before the [scanning electron] *charged particle* microscope image is captured.

*35. The method according to claim 1, wherein the charged particle microscope comprises a scanning electron microscope, and wherein the charged particle beam comprises an electron beam.*

*36. The assembly according to claim 33, wherein the charged particle microscope comprises a scanning electron microscope, and wherein the charged particle beam comprises an electron beam.*

*37. The non-transitory computer readable medium according to claim 34, wherein the charged particle microscope comprises a scanning electron microscope, and wherein the charged particle beam comprises an electron beam.*

* * * * *